(12) United States Patent
Chen et al.

(10) Patent No.: US 11,229,134 B2
(45) Date of Patent: Jan. 18, 2022

(54) HANDLE DEVICE, CHASSIS AND SERVER

(71) Applicant: Wistron Corp., New Taipei (TW)

(72) Inventors: Ching-Hao Chen, New Taipei (TW);
Yu-Chen Lin, New Taipei (TW); Li Shu Chen, New Taipei (TW);
Tai-Hsun Wu, New Taipei (TW);
Jun-Hao Wang, New Taipei (TW)

(73) Assignee: WISTRON CORP., New Taipei (TW)

( * ) Notice: Subject to any disclaimer, the term of this patent is extended or adjusted under 35 U.S.C. 154(b) by 2 days.

(21) Appl. No.: 15/931,736

(22) Filed: May 14, 2020

(65) Prior Publication Data

US 2021/0204420 A1 Jul. 1, 2021

(30) Foreign Application Priority Data

Dec. 26, 2019 (CN) .......................... 201911365575.2

(51) Int. Cl.
*H05K 5/00* (2006.01)
*H05K 5/02* (2006.01)

(52) U.S. Cl.
CPC .................................. *H05K 5/023* (2013.01)

(58) Field of Classification Search
CPC ........ H05K 5/023; H05K 5/03; H05K 5/0221; H05K 5/0204; H05K 5/0239; H05K 7/1488; E05C 1/00; E05C 1/004; E05C 1/02; E05C 1/06; E05C 1/04; E05C 1/10; E05C 1/065; E05C 19/06; E05C 19/006; Y10T 292/096; Y10T 292/1015; Y10T 292/102; Y10T 292/1016; Y10S 292/11; G06F 1/1601; G06F 1/181; G06F 1/18; G06F 1/187; B65D 43/12; B65D 43/20
USPC ............ 312/223.3, 265.5, 265.6, 244, 332.1; 220/345.1, 351, 345.4; 49/463;
(Continued)

(56) References Cited

U.S. PATENT DOCUMENTS

2004/0222647 A1* 11/2004 Smith .................... E05C 19/006
292/336.3
2014/0001942 A1* 1/2014 Mao ...................... H05K 5/0239
312/333

(Continued)

FOREIGN PATENT DOCUMENTS

| CN | 2458652 Y | | 11/2001 |
| WO | 2010014108 | * | 2/2010 |
| WO | 2016018241 | * | 2/2016 |

OTHER PUBLICATIONS

Taiwan Patent Office, "Office Action", dated Aug. 18, 2020, Taiwan.

*Primary Examiner* — Janet M Wilkens
(74) *Attorney, Agent, or Firm* — Locke Lord LLP; Tim Tingkang Xia, Esq.

(57) ABSTRACT

A handle device is configured for a chassis body. The chassis body includes a main part and a cover plate. The handle device includes a base part and a handle part. The base part is disposed on the cover plate. The handle part includes an operative part, a coupling part and a shaft part. The coupling part is connected to the operative part. The shaft part is connected to the coupling part. The coupling part of the handle part is pivotally coupled to the base part. The shaft part is rotatably disposed on the main part. The handle part is movable relative to the base part so as to disengage the cover plate from the main part.

18 Claims, 14 Drawing Sheets

(58) Field of Classification Search
USPC ......... 361/379.33, 679.37, 679.58, 726, 727; 174/50
See application file for complete search history.

(56) References Cited

U.S. PATENT DOCUMENTS

2015/0315811 A1* 11/2015 Mao ..................... E05B 5/003
  292/336.3
2019/0394893 A1* 12/2019 Wu ...................... H05K 5/0226

* cited by examiner

HANDLE DEVICE, CHASSIS AND SERVER

CROSS-REFERENCE TO RELATED APPLICATIONS

This non-provisional application claims priority under 35 U.S.C. § 119(a) on Patent Application No(s). 201911365575.2 filed in China on Dec. 26, 2019, the entire contents of which are hereby incorporated by reference.

TECHNICAL FIELD

This disclosure relates to a handle device, a chassis, and a server, more particularly to a handle device having a thin configuration and a chassis and a server having the handle device.

BACKGROUND

Servers are a type of computer that can manage or provide data to other computers at clients end. The services may include providing storage space or data sharing among multiple users. The basic structure of a server is pretty much similar to that of a personal computer, including some essential components such as CPU, memory, and I/O device. In most cases, the server has a cover plate for covering and protecting the internal components, and the cover plate is slidable and can be engaged or disengaged with the server casing by a handle thereon.

With the increasing demand for higher performance and more functionalities, the number of the internal components of the servers is largely increased as well. This makes the server's internal space become very limited and thus reducing the room supposed for the installation of the cover plate handle. As a result, the conventional handle is no longer suitable for the new generation servers. As can be seen, how to reduce the size of the cover plate handle is a challenge for new servers.

SUMMARY

The present disclosure is to provide a handle device having a thin configuration and also provide a chassis and a server having the handle device.

One embodiment of the disclosure provides a handle device configured to be provided on a chassis body. The chassis body includes a main part and a cover plate. The handle device includes a base part and a handle part. The base part is configured to be disposed on the cover plate. The handle part includes an operative part, a coupling part and a shaft part. The coupling part is connected to the operative part. The shaft part is connected to the coupling part. The coupling part of the handle part is pivotally coupled to the base part. The shaft part is rotatably disposed on the main part. The handle part is movable relative to the base part so as to disengage the cover plate from the main part.

One embodiment of the disclosure provides a chassis including a chassis body and a handle device. The chassis body includes a main part and a cover plate. The cover plate is detachably disposed on the main part. The handle device includes a base part and a handle part. The base part is disposed on the cover plate. The handle part includes an operative part, a coupling part and a shaft part. The coupling part is connected to the operative part. The shaft part is connected to the coupling part. The coupling part of the handle part is pivotally coupled to the base part. The shaft part is rotatably disposed on the main part. The handle part is movable relative to the base part so as to disengage the cover plate from the main part.

One embodiment of the disclosure provides a server includes a server main body and a handle device. The server main body includes a chassis body. The chassis body includes a main part and a cover plate. The cover plate is detachably disposed on the main part. The handle device includes a base part and a handle part. The base part is disposed on the cover plate. The handle part includes an operative part, a coupling part and a shaft part. The coupling part is connected to the operative part. The shaft part is connected to the coupling part. The coupling part of the handle part is pivotally coupled to the base part. The shaft part is rotatably disposed on the main part. The handle part is movable relative to the base part so as to disengage the cover plate from the main part.

According to the handle device, chassis and server as described above, the operative part and the connecting part are non-parallel to each other such that when the handle part is alongside the base part, the operative part of the handle part is located in the recess, and the connecting part of the handle part partially protrudes from the base part. At this moment, the thickness of the handle device at the operative part is smaller than the thickness of the handle device at the connecting part, and the handle device does not have interference with the fan frame arranged therebelow. Accordingly, the handle device is suitable for the application having a very limited space above fan frame, where said space may be smaller than 6 mm or even smaller than 3 mm.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
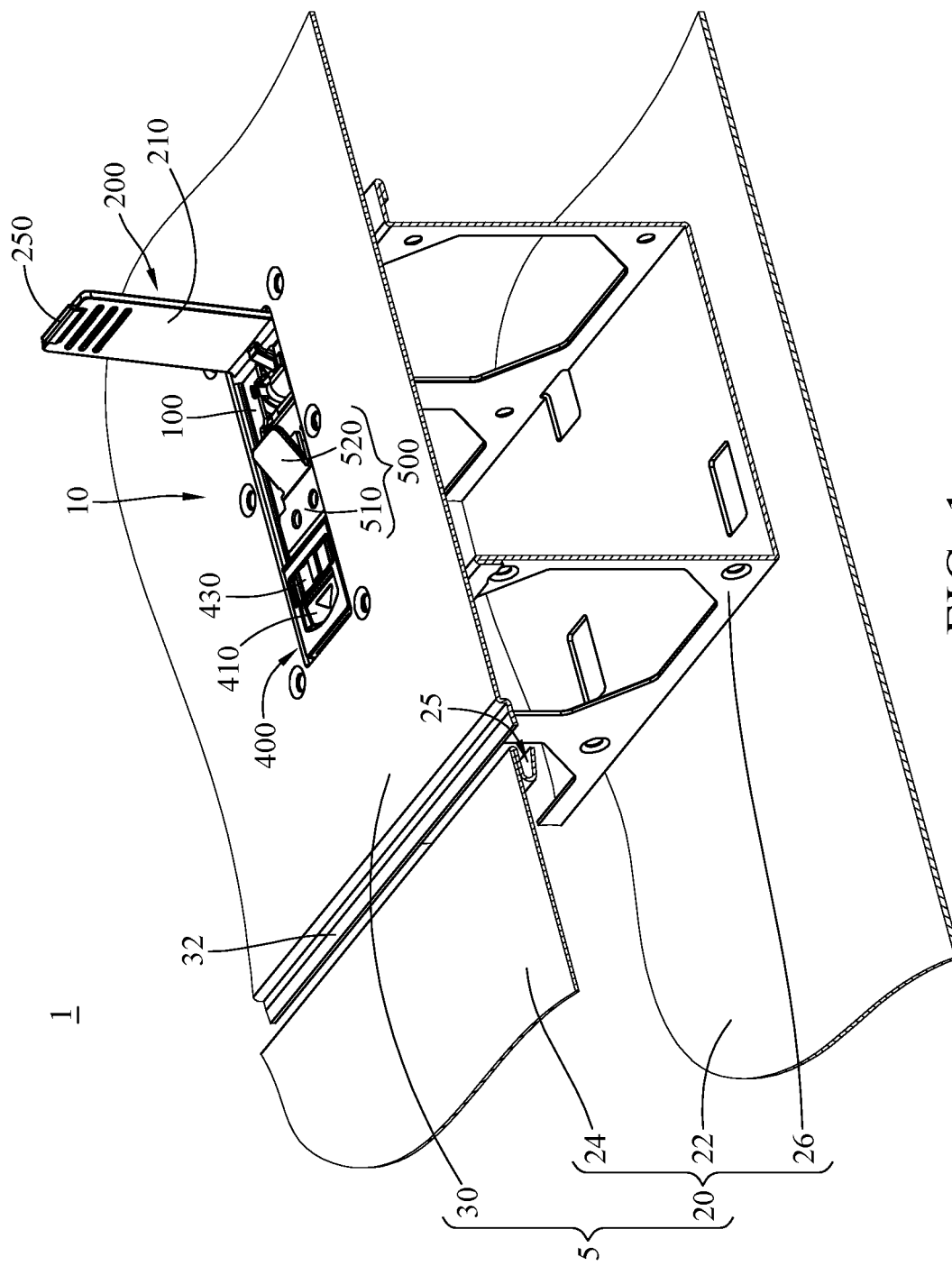
FIG. 1 is a perspective view of a handle device disposed on a chassis body in accordance with one embodiment of the disclosure.
Figure 2:
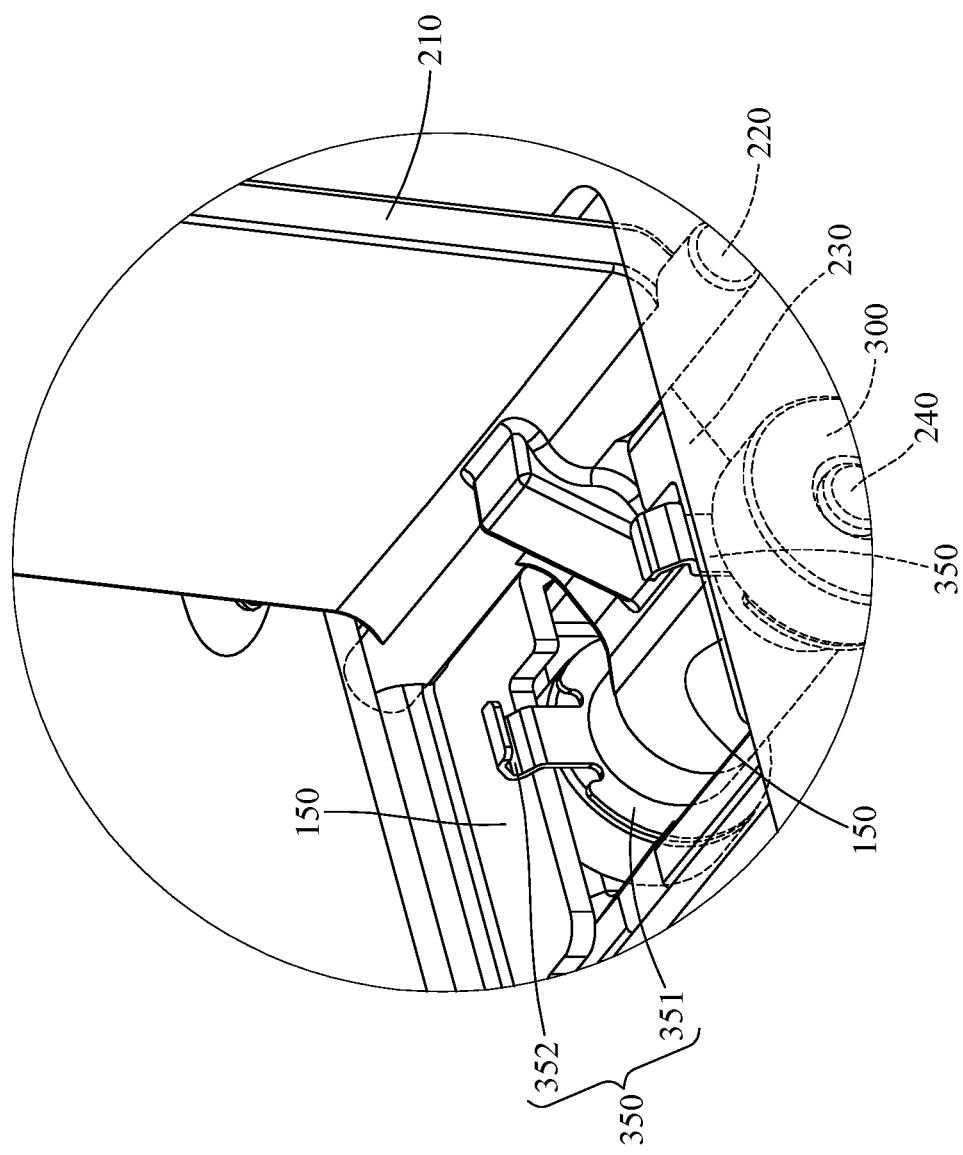
FIG. 2 is a partially enlarged view of FIG. 1.
Figure 3:
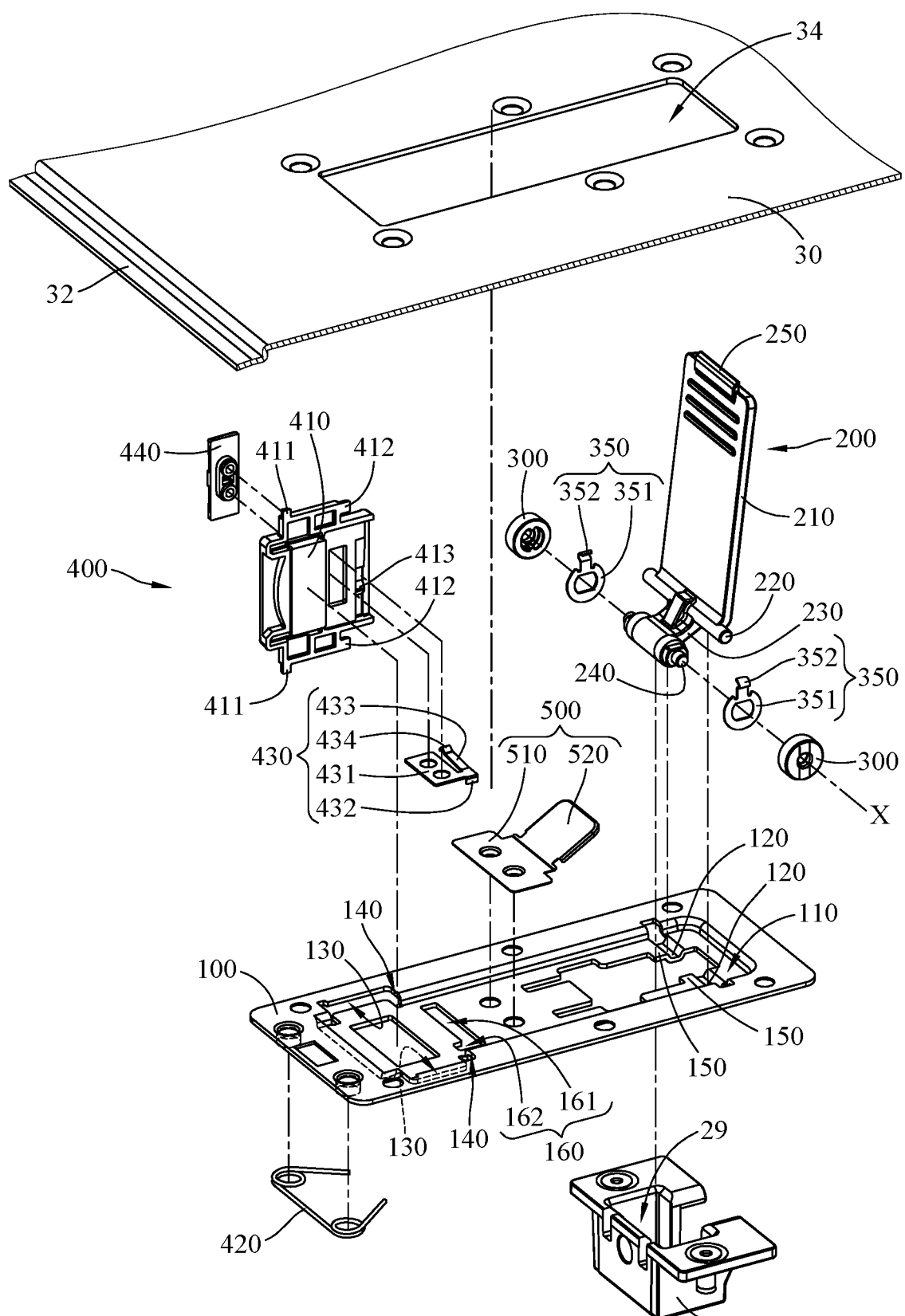
FIG. 3 is an exploded view of FIG. 1.

Please refer to FIG. 1 to FIG. 3. FIG. 1 is a perspective view of a handle device disposed on a chassis body in accordance with one embodiment of the disclosure. FIG. 2 is a partially enlarged view of FIG. 1. FIG. 3 is an exploded view of FIG. 1.

In this embodiment, a chassis 1 is provided, and the chassis 1 is, for example, a server chassis. The chassis 1 includes a chassis body 5 and a handle device 10. The chassis body 5 includes a main part 20 and a cover plate 30. The main part 20 includes a bottom plate 22, a top plate 24, a fan frame 26, and an accommodation seat 28. The top plate 24 is fixed above the bottom plate 22 and has an engagement slot 25. The fan frame 26 is fixed above the bottom plate 22, and the fan frame 26 is located below the top plate 24 during the normal operation. The accommodation seat 28 is, for example, fixed to the fan frame 26. The accommodation seat 28 has an accommodation space 29. In the disclosure, the accommodation seat 28 is not restricted to be fixed to the fan frame 26; in other embodiments, the accommodation seat may be fixed to other frame structures of the chassis body, if any. The cover plate 30 is slidably disposed on the main part 20 and has an engagement portion 32. The engagement portion 32 of the cover plate 30 is configured to be inserted into the engagement slot 25 of the top plate 24 so as to keep the cover plate 30 in the desired position shown in FIG. 1 and to prevent the cover plate 30 from moving away from the main part 20 (e.g., a vertical direction V1 shown in FIG. 4). Additionally, the cover plate 30 may be cooperated with a base part 100 of the handle device 10, and the cover plate 30 further has a through hole 34 to expose the base part 100.

Specifically, in this embodiment, the handle device 10 includes the base part 100 and a handle part 200. The base part 100 is fixed to the cover plate 30. The base part 100 has a recess 110 and two coupling grooves 120. The recess 110 is connected to the through hole 34 of the cover plate 30; in other words, the through hole 34 exposes the recess 110. The two coupling grooves 120 are located in the recess 110. In addition, the base part 100 further has two first guiding slots 130 and two second guiding slots 140. The first guiding slots 130 and the second guiding slots 140 are located in the recess 110. An extension direction of the first guiding slot 130 is different from an extension direction of the second guiding slot 140; that is, the first guiding slot 130 and the second guiding slot 140 extend in different directions. In this embodiment, the extension direction of the first guiding slot 130 is substantially perpendicular to the extension direction of the second guiding slot 140, but the present disclosure is not limited thereto. In other embodiments, the extension direction of the first guiding slot may have any desired angle to the extension direction of the second guiding slot as long as the first and second guiding slots are non-parallel to each other. Furthermore, in this embodiment, the base part 100 may have a thickness ranging from 2 mm to 5 mm. For instance, the thickness of the base part 100 may be 2.5 mm.

Figure 4:
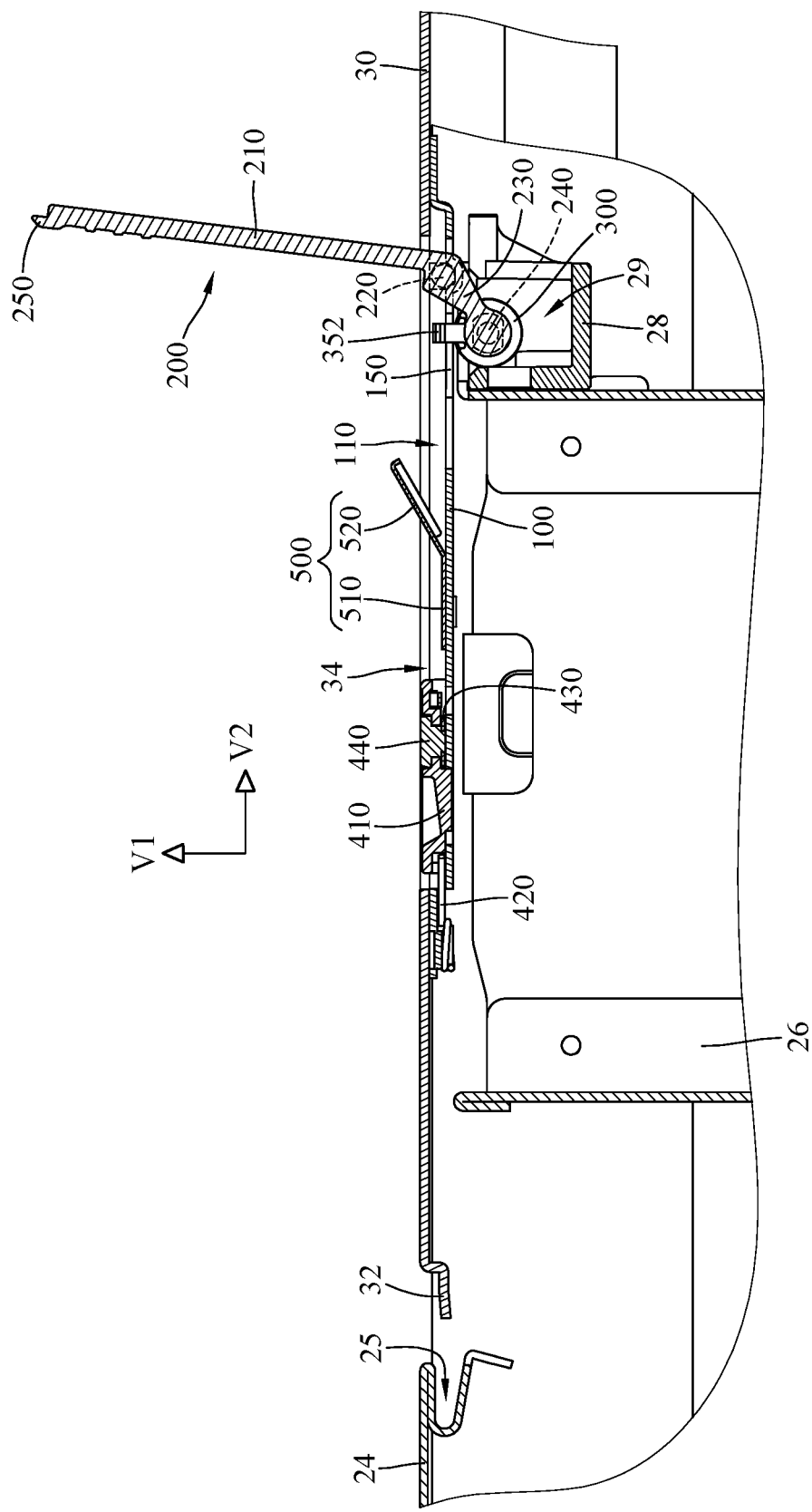
FIG. 4 is a partial enlarged and cross-sectional view of FIG. 1.
Figure 5:
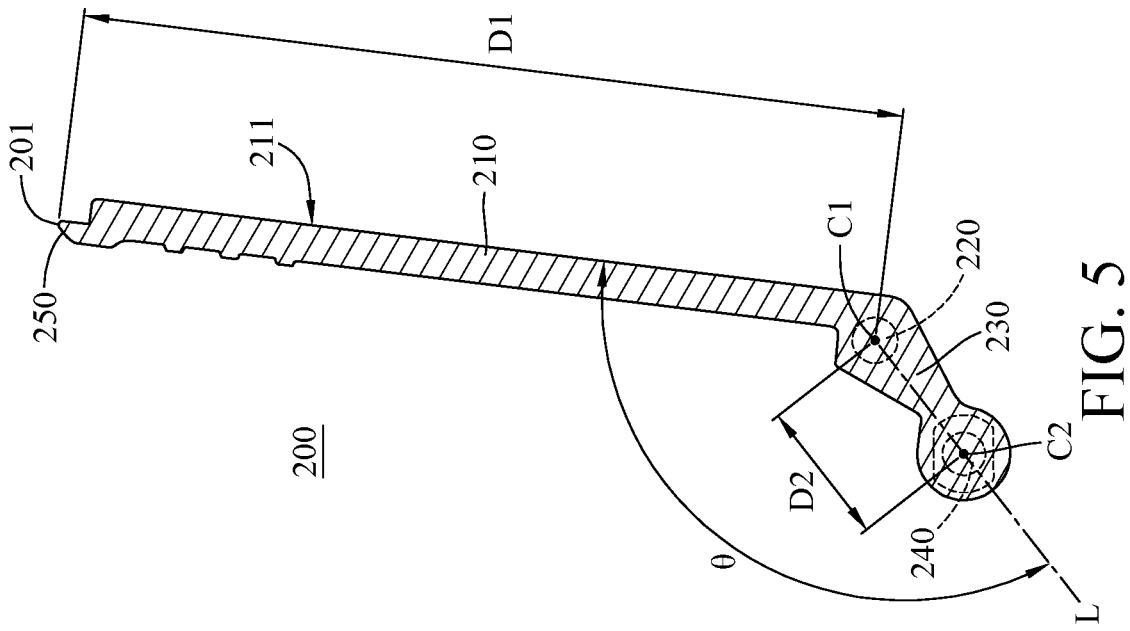
FIG. 5 depicts the handle part in FIG. 4.
Figure 6:
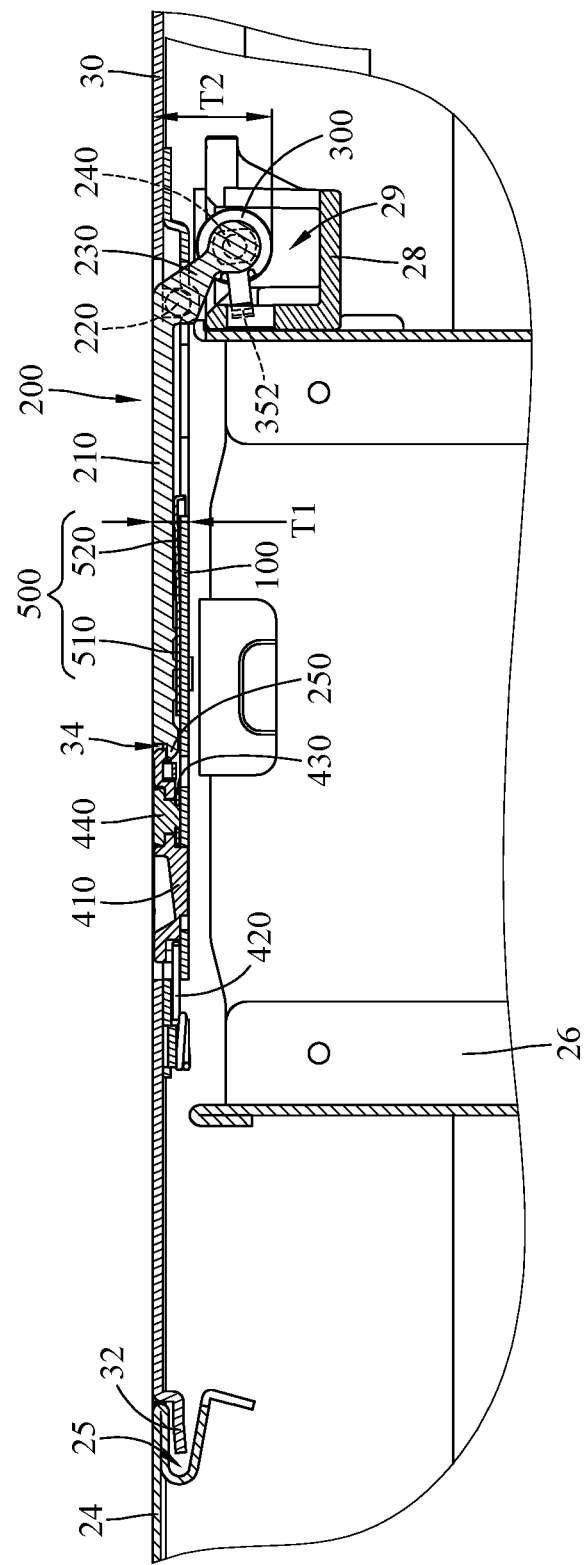
FIG. 6 shows that the handle part in FIG. 4 is moved to be alongside the base part.

Please refer to FIG. 3 to FIG. 6. FIG. 4 is a partial enlarged and cross-sectional view of FIG. 1. FIG. 5 depicts the handle part in FIG. 4. FIG. 6 shows that the handle part in FIG. 4 is moved to be alongside the base part.

The handle part 200 includes an operative part 210, a coupling part 220, a connecting part 230, and a shaft part 240. The coupling part 220 is connected to one side of the operative part 210. The coupling part 220 is connected to the shaft part 240 via the connecting part 230. Two opposite ends of the coupling part 220 are pivotally coupled to the coupling grooves 120 of the base part 100, respectively. The shaft part 240 is rotatably and slidably disposed in the accommodation space 29 of the accommodation seat 28. As such, the handle part 200 is movable relative to the base part 100 so as to force the cover plate 30 to engage with or to disengage from the main part 20. In detail, the handle part 200 can be opened relative to the base part 100 (as shown in FIG. 4) or moved to be alongside the base part 100 (as shown in FIG. 6). While the handle part 200 is being opened relative to the base part 100, the handle part 200 passes through the through hole 34 of the cover plate 30 and forces the cover plate 30 to move away from the top plate 24 so as to disengage the engagement portion 32 of the cover plate 30 from the engagement slot 25 of the top plate 24. On the other hand, while the handle part 200 is being moved to be alongside the base part 100, the handle part 200 forces the cover plate 30 to move towards the top plate 24 so as to engage the engagement portion 32 of the cover plate 30 with the engagement slot 25 of the top plate 24. As shown, during the above movement of the handle part 200, the shaft part 240 can be moved along the vertical direction V1 and a horizontal direction V2 relative to the accommodation seat 28, such that the shaft part 240 can be considered as a movable fulcrum to the coupling part 220. Specifically, during the movement of the handle part 200 with respect to the base part 100, the coupling part 220 can be pivoted relative to the shaft part 240 and carry the base part 100 and the cover plate 30 along the horizontal direction V2.

As shown in FIG. 5, in this embodiment, the operative part 210 and the connecting part 230 are non-parallel to each other. In more detail, the operative part 210 is in a plate shape, a line L passing through an axis C2 of the shaft part 240 and an axis C1 of the coupling part 220 is defined, and an angle θ is between a surface 211 of the operative part 210 the line L. As shown, the angle θ is larger or equal to 90 degrees and smaller than 180 degrees. Further, in this embodiment, as shown in FIG. 6, when the handle part 200 is alongside the base part 100, the operative part 210 of the handle part 200 is located in the recess 110, and the connecting part 230 of the handle part 200 partially protrudes from the base part 100. At this moment, the handle device 10 has a thickness T1 at the operative part 210, the handle device 10 has a thickness T2 at the connecting part 230, where the thickness T1 is smaller than the thickness T2 and does not have interference with the fan frame 26 which is arranged below the handle device 10. Accordingly, the handle device 10 is suitable for the application having a very limited space above fan frame, where said space may be smaller than 6 mm or even smaller than 3 mm.

In some cases, the thickness T2 at the connecting part 230 may be larger than, for example, 6 mm, but the protrusion portion of the connecting part 230 does not affect arranging the handle device 10 on a server having a very limited space above the fan frame since the connecting part 230 of the handle part 200 is not arranged right above the fane frame 26.

Note that, in other embodiments, the operative part may be at an acute angle to the connecting part.

As shown in FIG. 5, in this embodiment, the handle part 200 has a free end 201. The coupling part 220 is located between the free end 201 and the shaft part 240, and a distance D1 between the free end 201 and the coupling part 220 is larger than a distance D2 between the axis C2 of the shaft part 240 and the coupling part 220. This configuration makes the operation of the handle part 200 more effortless.

As shown in FIG. 3 and FIG. 4, in this embodiment, the handle device 10 further includes two rollers 300. The two rollers 300 are rotatably disposed on two opposite ends of the shaft part 240, and the shaft part 240 is rotatably disposed in the accommodation seat 28 via the two rollers 300. The rollers 300 are to minimize the friction resistance between the handle part 200 and the accommodation seat 28.

As shown in FIG. 2 and FIG. 3, in this embodiment, the base part 100 has two positioning portions 150 located in the recess 110. The handle part 200 further includes two elastic positioning components 350. Each elastic positioning component 350 includes a mounting part 351 and a positioning part 352. The mounting parts 351 of the elastic positioning components 350 are respectively fixed to two opposite ends of the shaft part 240. The positioning parts 352 of the elastic positioning components 350 are respectively connected to the mounting parts 351 of the elastic positioning components 350. While the handle part 200 is being opened relative to the base part 100, the elastic positioning components 350 respectively press against the positioning portions 150 so as to keep the handle part 200 opened.

Note that the quantities of the positioning portions 150 and elastic positioning components 350 are not restricted to be two; in other embodiments, the base part may only have one positioning portion and the handle part may only have one elastic positioning component.

As shown in FIG. 3 and FIG. 4, in this embodiment, the handle part 200 further includes an engaging part 250. The engaging part 250 is connected to one side of the operative part 210 located away from the connecting part 230. The handle device 10 further includes a lock assembly 400. The lock assembly 400 includes an engaging component 410 and a restoring component 420. The engaging component 410 is slidably disposed in the recess 110 of the base part 100 and is slidable between an engaging position and a releasing position. Specifically, the engaging component 410 has two first guiding protrusions 411 and two second guiding protrusions 412. The first guiding protrusions 411 respectively protrude from two opposite sides of the engaging component 410. The second guiding protrusions 412 are respectively located at two opposite sides of the engaging component 410 and both protrude towards a direction away from the restoring component 420. As shown, the first guiding protrusions 411 extend in directions different from that of the second guiding protrusions 412. In one embodiment, each of the first guiding protrusions 411 may extend in a direction perpendicular to the extension direction of the second guiding protrusions 412. The first guiding protrusions 411 are slidably located in the first guiding slots 130, and the second guiding protrusions 412 are slidably located in the second guiding slots 140, such that the engaging component 410 is prevented from detaching from the base part 100 while sliding. In addition, when the handle part 200 is alongside the base part 100, the operative part 210 of the handle part 200 and the engaging component 410 are both located in the recess 110 side by side and parallel to each other, such that the engaging part 250 of the handle part 200 can be engaged with the engaging component 410 (i.e., the engaging position) or disengaged from the engaging component 410 (i.e., the releasing position).

The restoring component 420 is elastic and made of, for example, a single iron wire. As shown, the restoring component 420 is fixed on the base part 100 and has two elastic arms pressing against the engaging component 410 in order to return the engaging component 410 to the engaging position. That is, the restoring component 420 is a biasing spring to constantly force the engaging component 410 to move towards the engaging position.

In this embodiment, the base part 100 has a positioning groove 160. The positioning groove 160 includes a restricting part 161 and a releasing part 162. The restricting part 161 substantially extends along the axis X of the coupling part 220, and the releasing part 162 substantially extends along a direction perpendicular to the axis X. The lock assembly 400 further includes a lock component 430 and a switch 440. The lock component 430 includes a main portion 431 and a positioning protrusion portion 432 connected to each other. The main portion 431 of the lock component 430 is slidably disposed on the engaging component 410. The positioning protrusion portion 432 is slidably located in the positioning groove 160. When the positioning protrusion portion 432 is located at the restricting part 161, the engaging component 410 is maintained in the engaging position. When the positioning protrusion portion 432 is located at the releasing part 162, the engaging component 410 is allowed to move to the releasing position.

The switch 440 and the main portion 431 of the lock component 430 are fixed to each other and respectively located on two opposite sides of the engaging component 410, such that the user is allowed to move the lock component 430 by switching the switch 440.

In this embodiment, the engaging component 410 further has a positioning protrusion 413. The lock component 430 further includes an elastic arm part 433 and a positioning protruding part 434. The elastic arm part 433 is connected to the main portion 431, and the positioning protruding part 434 is connected to the main portion 431 via the elastic arm part 433 and therefore movable relative to the main portion 431. When the positioning protrusion portion 432 is moved between the releasing part 162 and the restricting part 161, the positioning protruding part 434 can slide across the positioning protrusion 413 from one side of the positioning protrusion 413 and abut the opposite side of the positioning protrusion 413. As such, the positioning protrusion portion 432 can be positioned at the restricting part 161 or the releasing part 162 by the collaboration of the positioning protruding part 434 and the positioning protrusion 413.

In this embodiment, the handle device 10 further includes an elastic component 500. The elastic component 500 includes a mounting part 510 and an elastic part 520. The mounting part 510 is mounted on the base part 100. The elastic part 520 is connected to the mounting part 510 and is non-parallel to the mounting part 510. The elastic part 520 is located between the base part 100 and the operative part 210 of the handle part 200 to facilitate opening the handle part 200.

Then, please refer to FIG. 6 to FIG. 14. The operation processes of the handle device and chassis body in FIG. 1 are illustrated.

Firstly, as shown in FIG. 6, the operative part 210 of the handle part 200 is moved to be alongside the base part 100 so as to make the engagement portion 32 of the cover plate 30 engage with the engagement slot 25 of the top plate 24.

Figure 7:
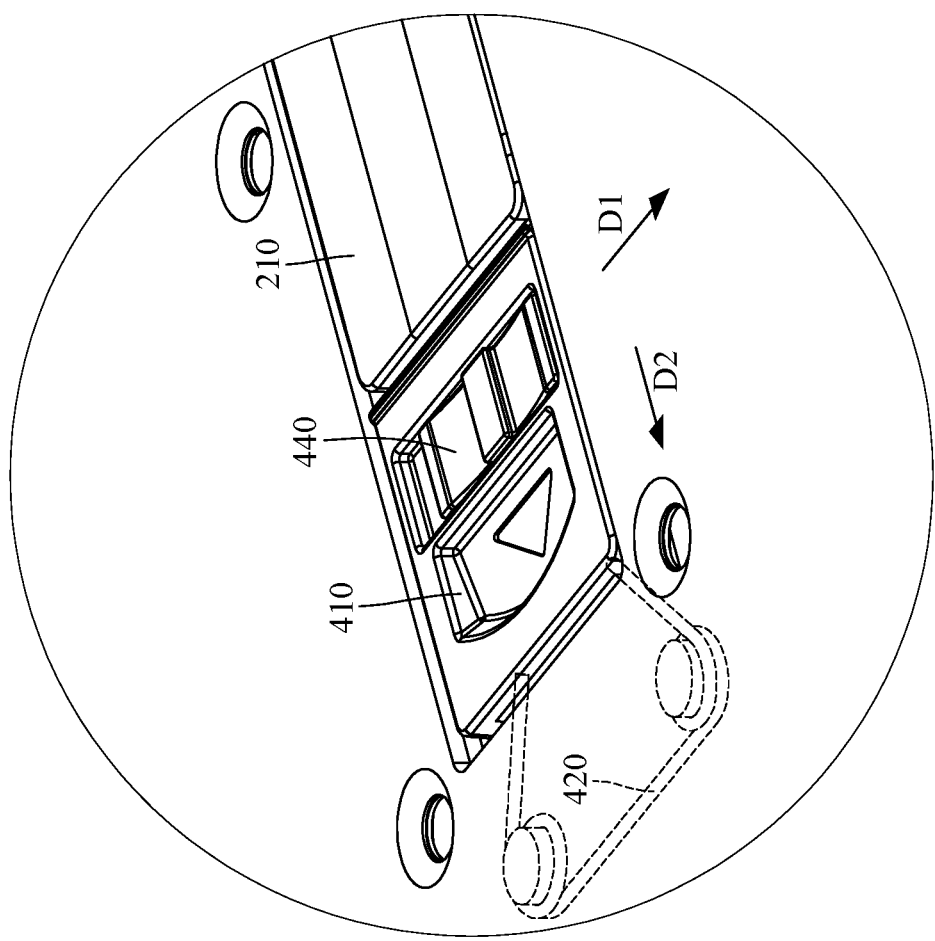
FIG. 7 to FIG. 14 illustrate the operation processes of the handle device and chassis body in FIG. 1.
Figure 8:
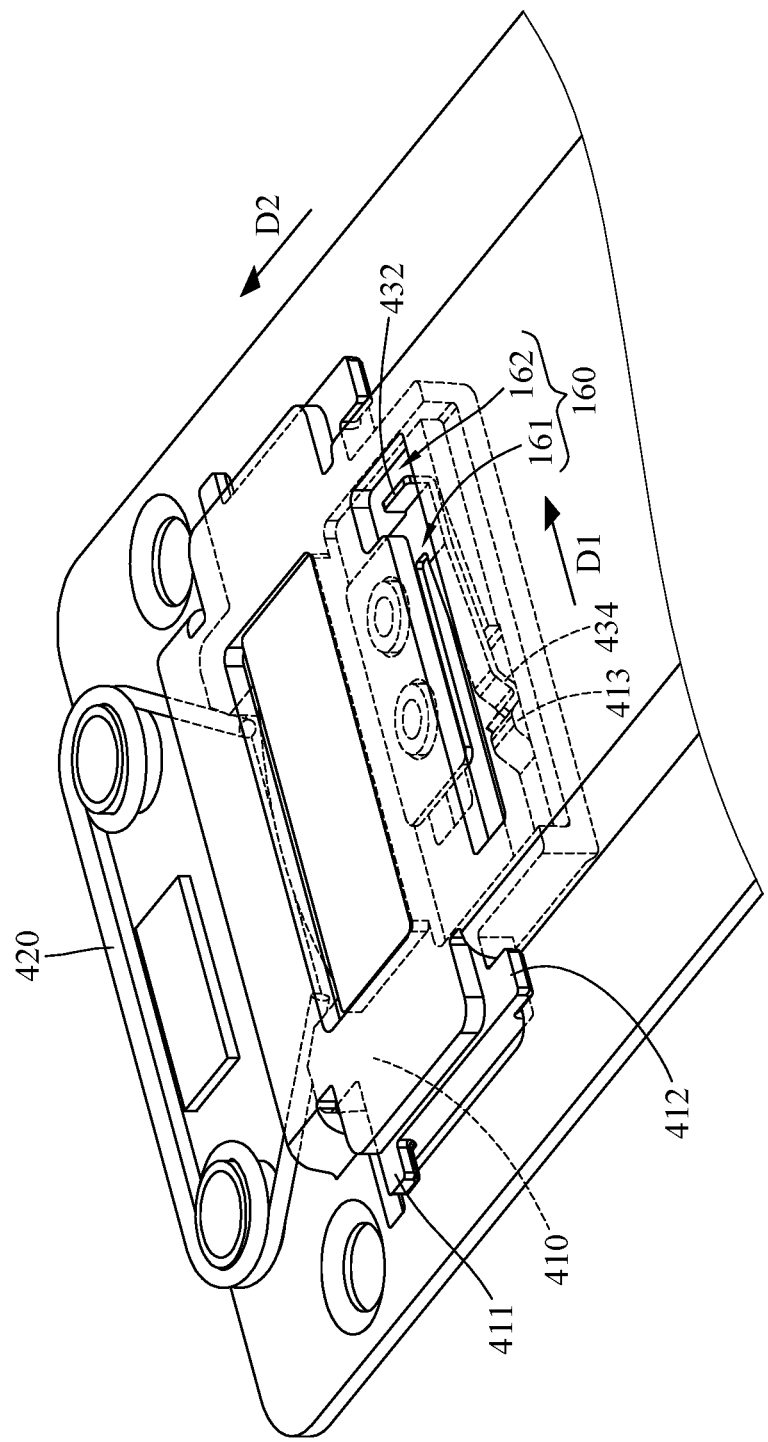

Then, as shown in FIG. 7 and FIG. 8, the processes to open the cover plate 30 are illustrated. As shown, the switch 440 is moved along a direction D1 to move the positioning protrusion portion 432 of the lock component 430 from the restricting part 161 to the releasing part 162 of the positioning groove 160. And during the movement of the positioning protrusion portion 432 from the restricting part 161 to the releasing part 162, the positioning protruding part 434 of the lock component 430 slides across the positioning protrusion 413 from one side of the positioning protrusion 413 and abuts the opposite side of the positioning protrusion 413, such that the positioning protrusion portion 432 of the lock component 430 is fixed at the releasing part 162. Then, the engaging component 410 is moved along a direction D2 to disengage the engaging component 410 from the engaging part 250 of the handle part 200.

Figure 9:
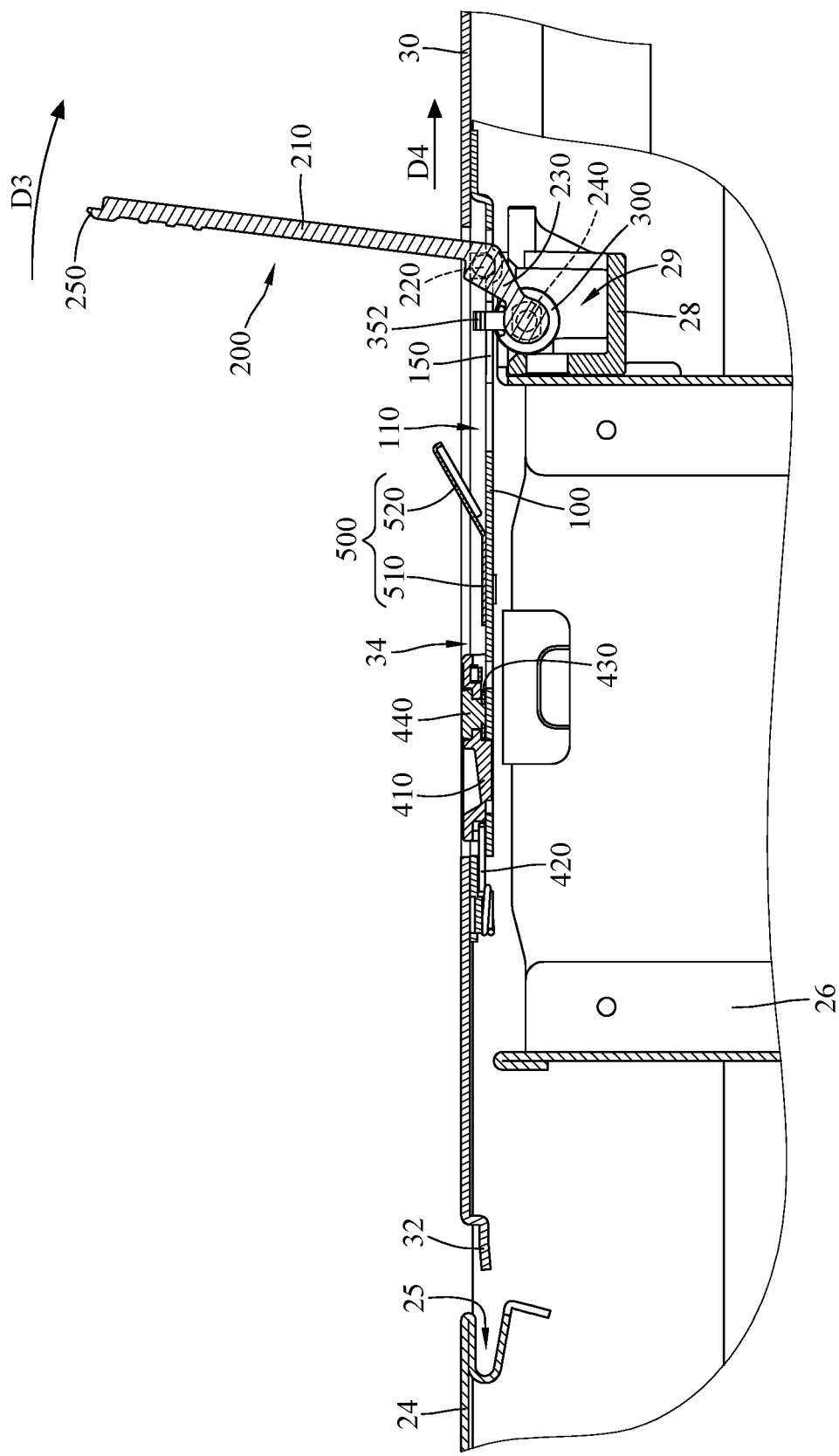

Then, as shown in FIG. 9, when the engaging component 410 is disengaged from the engaging part 250 of the handle part 200, the handle part 200 can be opened along a direction D3, and the movement of the handle part 200 can force the base part 100 to move along a direction D4 by the coupling part 220. During the movement of the base part 100 along the direction D4, the cover plate 30 is also moved along the direction D4 with the base part 100 so that the engagement portion 32 of the cover plate 30 is disengaged from the engagement slot 25 of the top plate 24.

Note that the elastic energy stored in the elastic part 520 of the elastic component 500 will be released to push the operative part 210 of the handle part 200 as the engaging component 410 is disengaged from the engaging part 250 of the handle part 200. As such, it would be easier for the user to open the handle part 200 along the direction D3.

Figure 10:
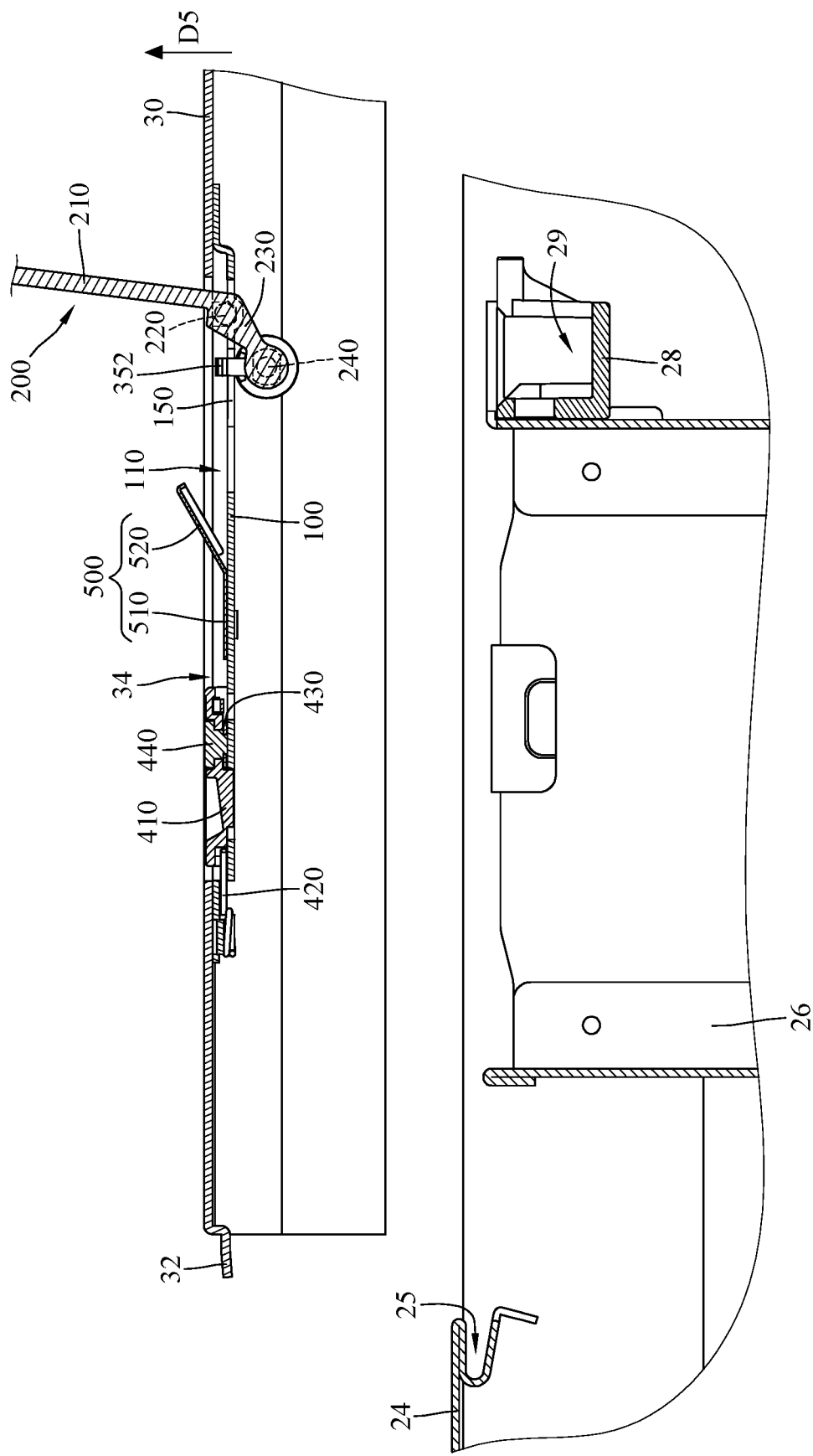

Then, as shown in FIG. 10, when the engagement portion 32 of the cover plate 30 is disengaged from the engagement slot 25 of the top plate 24, the cover plate 30 can be removed along a direction D5 for the interior maintenance of the chassis body 5.

Figure 11:
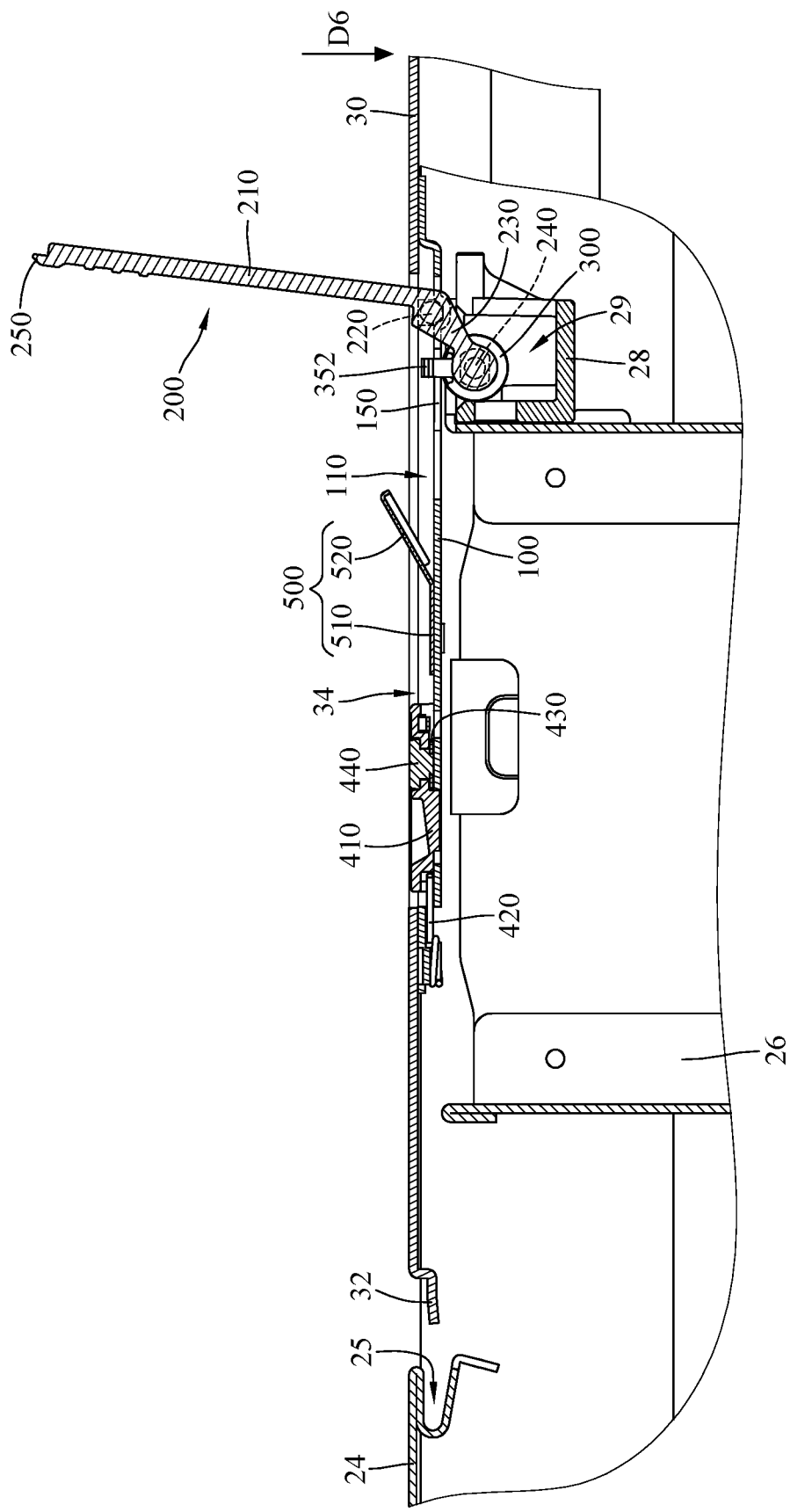

Then, as shown in FIG. 11, when it is required, the cover plate 30 can be placed back on the main part 20 along a direction D6.

Figure 12:
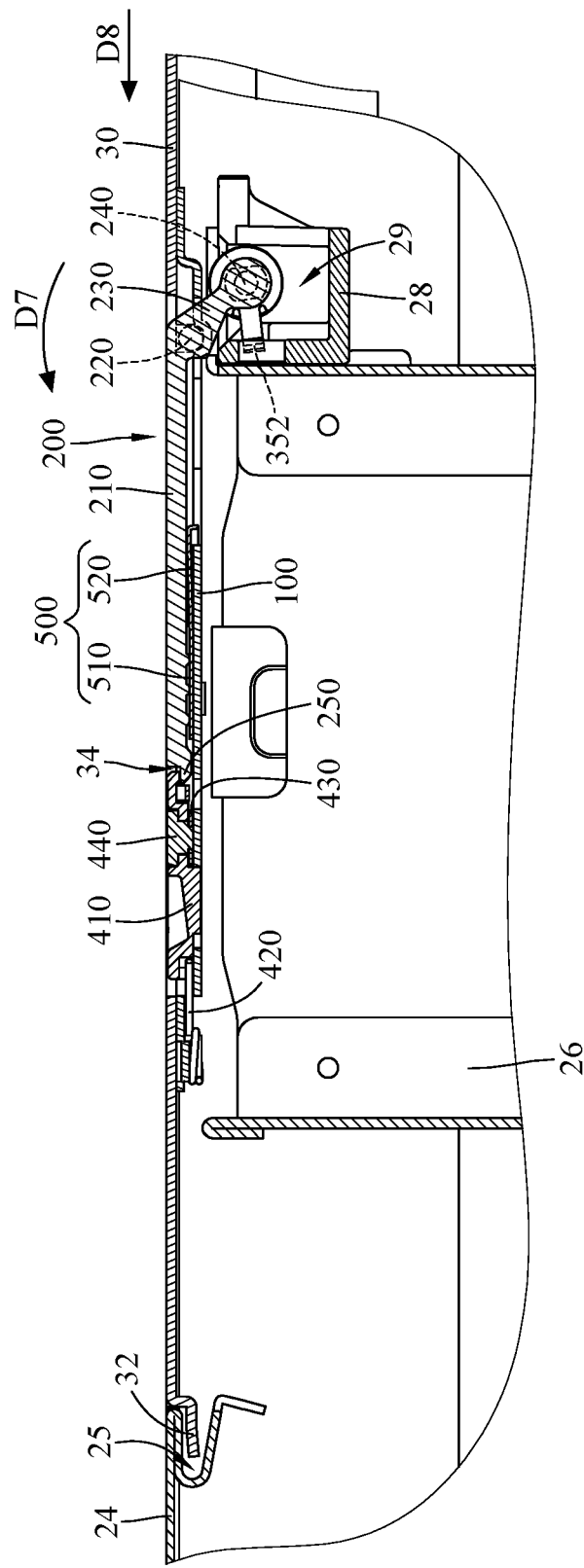

Then, as shown in FIG. 12, the cover plate 30 is placed back on the main part 20, and the handle part 200 can be moved to be alongside the base part 100 along a direction D7. And the movement of the handle part 200 along the direction D7 can force the base part 100 and the cover plate 30 to move along the direction D8 so as to re-engage the engagement portion 32 of the cover plate 30 with the engagement slot 25 of the top plate 24.

Figure 13:
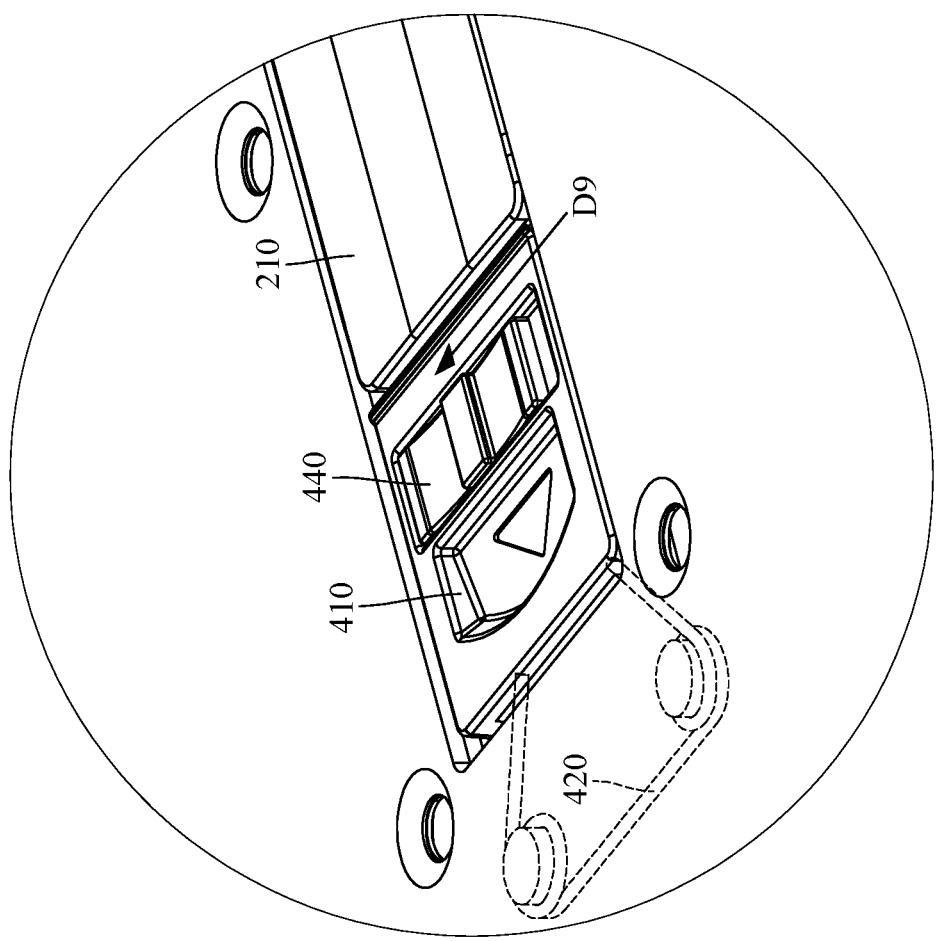
Figure 14:
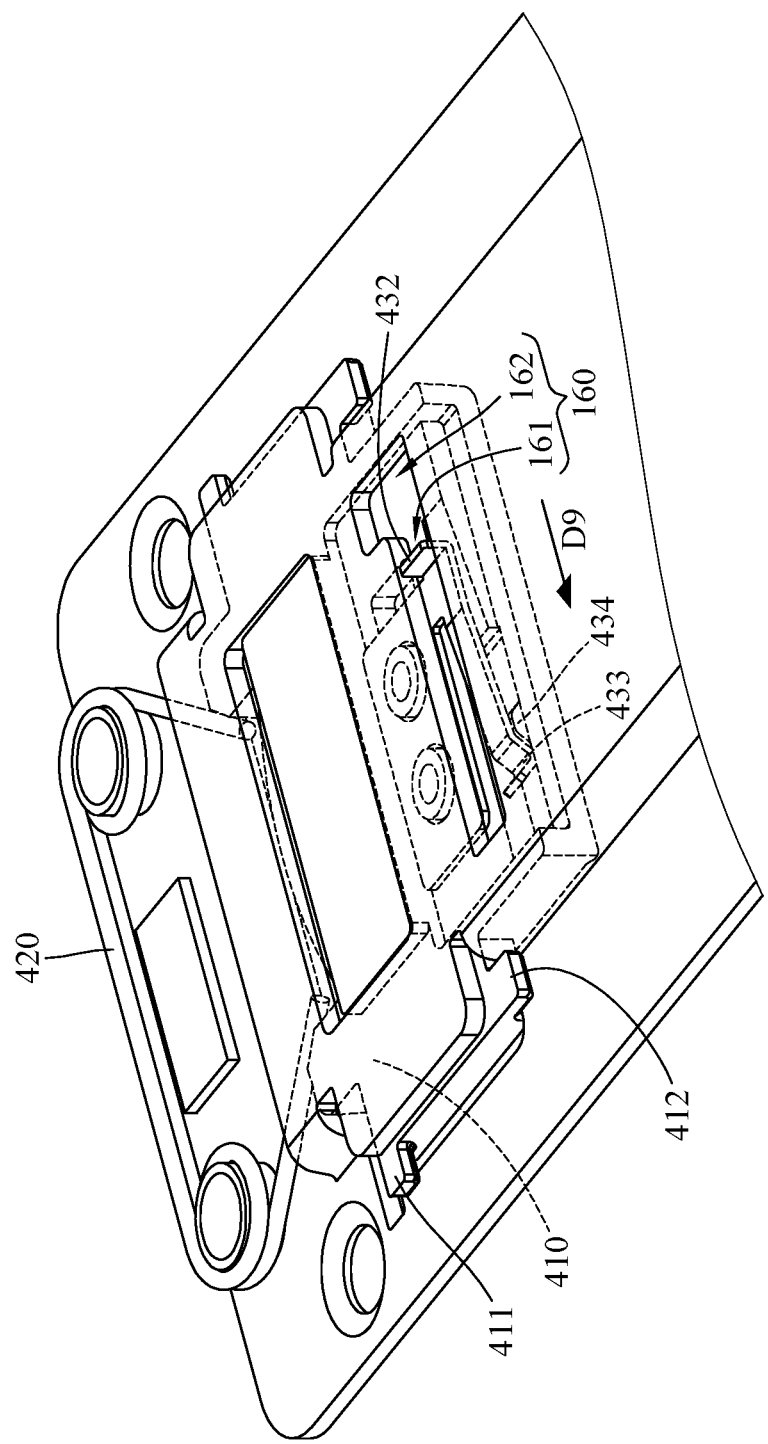

Then, as shown in FIG. 13 and FIG. 14, in order to secure the current position of the cover plate 30, the switch 440 is moved along a direction D9 to force the positioning protrusion portion 432 of the lock component 430 to move from the releasing part 162 to the restricting part 161 of the positioning groove 160. During the movement of the positioning protrusion portion 432 of the lock component 430 from the releasing part 162 to the restricting part 161 of the positioning groove 160, the positioning protruding part 434 of the lock component 430 slides across the positioning protrusion 413 from one side of the positioning protrusion 413 and abuts the opposite side of the positioning protrusion 413 so that the positioning protrusion portion 432 of the lock component 430 is fixed at the restricting part 161. By doing so, the engaging component 410 cannot be moved toward a direction away from the handle part 200 because the positioning protrusion portion 432 of the lock component 430 is restricted by the restricting part 161 of the positioning groove 160, thereby keeping the engagement between the engaging component 410 and the engaging part 250 of the handle part 200. As a result, the position of the cover plate 30 is secured.

It is noted that the chassis 1 provided in the above embodiments are exemplary and the present disclosure is not limited thereto. The other embodiments of the disclosure may provide a server including a server main body and the handle device 10, where the server main body may include the chassis body 5 and other electronic components (not shown in figures), such as a motherboard, fan, hard drive, and power supplier.

According to the handle device, chassis, and server as described above, the operative part and the connecting part are non-parallel to each other such that when the handle part is alongside the base part, the operative part of the handle part is located in the recess, and the connecting part of the handle part partially protrudes from the base part. At this moment, the thickness of the handle device at the operative part is smaller than the thickness of the handle device at the connecting part, and the handle device does not have interference with the fan frame arranged therebelow. Accordingly, the handle device is suitable for the application having a very limited space above fan frame, where said space may be smaller than 6 mm or even smaller than 3 mm.

In addition, the shaft part is rotatably disposed in the accommodation seat via the rollers, and the rollers are to minimize the friction resistance between the handle part and the accommodation seat.

Moreover, the distance between the free end and the coupling part is larger than the distance between the axis of the shaft part and the coupling part. This configuration makes the operation of the handle part more effortless.

Furthermore, the mounting parts of the elastic positioning components are fixed to the shaft part, and when the handle part is being opened relative to base part, the mounting parts respectively press against the positioning portions so as to keep the handle part opened.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A handle device, configured to be provided on a chassis body, the chassis body comprising a main part and a cover plate, the handle device comprising:
   a base part, configured to be disposed on the cover plate;
   a handle part, comprising an operative part, a coupling part, a shaft part, and an engaging part, wherein the coupling part is connected to the operative part, the shaft part is connected to the coupling part, the engaging part is connected to one side of the operative part located away from the connecting part, the coupling part of the handle part is pivotally coupled to the base part, the shaft part is rotatably disposed on the main part, and the handle part is movable relative to the base part so as to disengage the cover plate from the main part; and
   a lock assembly, comprising an engaging component, a restoring component and a lock component, wherein the engaging component is slidably disposed on the base part and is slidable between an engaging position and a releasing position, one side of the restoring component presses against the base part and another side of the restoring component presses against the engaging component so as to force the engaging component to move forwards to the engaging position;
   wherein the lock component is slidably disposed on the engaging component so as to keep the engaging component in the engaging position or the engaging component is allowed to move towards the releasing position.

2. The handle device according to claim 1, wherein the handle part further comprises a connecting part, the connecting part connects the coupling part to the shaft part, the operative part is in a plate shape, a line passing through the shaft part and the coupling part is defined, an angle is between the line and the operation part, and the angle is larger or equal to 90 degrees and smaller than 180 degrees.

3. The handle device according to claim 1, wherein the base part has a positioning groove, the positioning groove comprises a restricting part and a releasing part, an extension direction of the restricting part is parallel to an axis of the coupling part, an extension direction of the releasing part is perpendicular to the axis of the coupling part, the lock component comprises a main portion and a positioning protrusion portion connected to each other, the main portion of the lock component is slidably disposed on the engaging component, the positioning protrusion portion is slidably located in the positioning groove; when the positioning protrusion portion is located at the restricting part, the positioning protrusion portion keeps the engaging component in the engaging position; when the positioning protrusion portion is located at the releasing part, the engaging component is movable towards the releasing position.

4. The handle device according to claim 3, wherein the engaging component has a positioning protrusion, the lock component further comprises an elastic arm part and a positioning protruding part connected to each other, the elastic arm part is connected to the main portion, the positioning protruding part is connected to the elastic arm part and is movable relative to the main portion via the elastic arm part; while the positioning protrusion portion is moved to the releasing part from the restricting part, the positioning protruding part slides across the positioning protrusion from one side of the positioning protrusion to another side of the positioning protrusion.

5. The handle device according to claim 1, wherein the base part has two first guiding slots and two second guiding slots, the engaging component has two first guiding protrusions and two second guiding protrusions, the two first guiding protrusions are respectively located on two opposite sides of the engaging component, the two second guiding protrusions are located on one side of the engaging component located away from the restoring component, the two first guiding protrusions are slidably located in the two first guiding slots, and the two second guiding protrusions are slidably located in the second guiding slots.

6. The handle device according to claim 1, further comprising two rollers, wherein the two rollers are rotatably disposed on two opposite ends of the shaft part, and the shaft part is rotatably disposed on the main part via the two rollers.

7. The handle device according to claim 1, further comprising an elastic component, wherein the elastic component comprises a mounting part and an elastic part, the mounting part is mounted on the base part, the elastic part is connected to the mounting part, the elastic part is non-parallel to the mounting part, the elastic part is located between the base part and the operative part of the handle part and is configured to open the handle part relative to the base part.

8. The handle device according to claim 1, further comprising at least one elastic positioning component, wherein the base part has a positioning portion, the at least one elastic positioning component is fixed to one end of the shaft part and configured to press against the positioning portion so as to keep the handle part in an open position relative to the base part.

9. The handle device according to claim 8, wherein the quantity of the at least one elastic positioning component is two, and the two elastic positioning components are respectively fixed to two opposite ends of the shaft part.

10. The handle device according to claim 1, wherein the base part has a recess; when the handle part is moved to be alongside the base part, the operative part of the handle part and the engaging component are located in the recess side by side and parallel to each other.

11. The handle device according to claim 10, wherein the base part has a thickness ranging between 2 mm to 5 mm.

12. The handle device according to claim 1, wherein the handle part has a free end, the coupling part is located between the free end and the shaft part, and a distance between the free end and the coupling part is larger than a distance between the shaft part and the coupling part.

13. A chassis, comprising:
a chassis body, comprising a main part, and a cover plate, the cover plate being detachably disposed on the main part; and
a handle device, comprising:
　a base part, disposed on the cover plate;
　a handle part, comprising an operative part, a coupling part, a shaft part, and an engaging part, wherein the coupling part is connected to the operative part, the shaft part is connected to the coupling part, the engaging part is connected to one side of the operative part located away from the connecting part, the coupling part of the handle part is pivotally coupled to the base part, the shaft part is rotatably disposed on the main part, and the handle part is movable relative to the base part so as to disengage the cover plate from the main part; and
　a lock assembly, comprising an engaging component, a restoring component and a lock component, wherein the engaging component is slidably disposed on the base part and is slidable between an engaging position and a releasing position, one side of the restoring component presses against the base part and another side of the restoring component presses against the engaging component so as to force the engaging component to move forwards to the engaging position;
　wherein the lock component is slidably disposed on the engaging component so as to keep the engaging component in the engaging position or the engaging component is allowed to move towards the releasing position.

14. The chassis according to claim 13, wherein the handle part further comprises a connecting part, the connecting part connects the coupling part to the shaft part, the operative part is in a plate shape, a line passing through the shaft part and the coupling part is defined, an angle is between the line and the operation part, and the angle is larger or equal to 90 degrees and smaller than 180 degrees.

15. The chassis according to claim 13, further comprising two rollers, wherein the two rollers are rotatably disposed on two opposite ends of the shaft part, and the shaft part is rotatably disposed on the main part via the two rollers.

16. The chassis according to claim 13, wherein the handle part has a free end, the coupling part is located between the free end and the shaft part, and a distance between the free end and the coupling part is larger than a distance between the shaft part and the coupling part.

17. A server, comprising:
a server main body, comprising a chassis body, the chassis body comprising a main part, and a cover plate, the cover plate being detachably disposed on the main part; and
a handle device, comprising:
　a base part, disposed on the cover plate;
　a handle part, comprising an operative part, a coupling part, a shaft part, and an engaging part, wherein the coupling part is connected to the operative part, the shaft part is connected to the coupling part, the engaging part is connected to one side of the operative part located away from the connecting part, the coupling part of the handle part is pivotally coupled to the base part, the shaft part is rotatably disposed on the main part, and the handle part is movable relative to the base part so as to disengage the cover plate from the main part; and
　a lock assembly, comprising an engaging component and a restoring component, wherein the engaging component is slidably disposed on the base part and is slidable between an engaging position and a releasing position, one side of the restoring component presses against the base part and another side of the restoring component presses against the engaging component so as to force the engaging component to move forwards to the engaging position;

wherein the base part has two first guiding slots and two second guiding slots, the engaging component has two first guiding protrusions and two second guiding protrusions, the two first guiding protrusions are respectively located on two opposite sides of the engaging component, the two second guiding protrusions are located on one side of the engaging component located away from the restoring component, the two first guiding protrusions are slidably located in the two first guiding slots, and the two second guiding protrusions are slidably located in the second guiding slots.

18. The server according to claim 17, wherein the handle part further comprises a connecting part, the connecting part connects the coupling part to the shaft part, the operative part is in a plate shape, a line passing through the shaft part and the coupling part is defined, an angle is between the line and the operation part, and the angle is larger or equal to 90 degrees and smaller than 180 degrees.

* * * * *